United States Patent
Young (10) Patent No.: US 6,680,484 B1
(45) Date of Patent: Jan. 20, 2004

(54) SPACE EFFICIENT INTERCONNECT TEST MULTI-STRUCTURE

(75) Inventor: Bradley Scott Young, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/277,265

(22) Filed: Oct. 22, 2002

(51) Int. Cl.[7] .............................................. H01L 23/58

(52) U.S. Cl. ....................................................... 257/48

(58) Field of Search .......................................... 257/48

(56) References Cited

U.S. PATENT DOCUMENTS

| | | | |
|---|---|---|---|
| 5,059,899 A | * 10/1991 | Farnworth et al. | 257/48 |
| 5,497,076 A | 3/1996 | Kuo et al. | |
| 6,027,859 A | 2/2000 | Dawson et al. | |
| 6,121,677 A | * 9/2000 | Song et al. | 257/48 |
| 6,133,582 A | * 10/2000 | Osann et al. | 257/48 |
| 6,340,823 B1 | * 1/2002 | Kitade | 257/48 |

OTHER PUBLICATIONS

*Journal of Applied Physics*, C. S. Hau–Reige and C. V. Thompson, vol. 87, No. 12, Jun. 15, 2000, pp. 8467–8472, "The effects of microstructural transitions at width transitions on interconnect reliability".

"Wafer Level Reliability Testing of Semiconductors", Jul., 2001, Reprinted from the Internet at: www.electroline.com.au/elc/feature_story/072001.asp.

* cited by examiner

*Primary Examiner*—Gene M. Munson
(74) *Attorney, Agent, or Firm*—Jacqueline J. Garner; W. James Brady, III; Frederick J. Telecky, Jr.

(57) ABSTRACT

The present invention relates to a test structure and a method for forming a test structure over a semiconductor substrate. The test structure comprises a plurality of patterned electrically conductive metal layers within a scribe line. The plurality of metal layers further comprises one or more lower metal layers comprising a plurality of split pads longitudinally spaced along the length of the scribe line, wherein a channel traversing the length of the scribe line is define. One or more top metal layers comprising a plurality of solid pads generally residing over the split pads defines a plurality of columns of pads. One or more conduits generally residing within the channel are associated with one or more lower metal layers and connect two or more split pads associated with the respective one or more lower metal layers, wherein a bow-tie lead is defined. One or more insulating layers are further disposed between the plurality of metal layers, and a plurality of pad vias electrically connect the respective split pads and solid pads associated with the respective two or more columns of pads.

20 Claims, 11 Drawing Sheets

SPACE EFFICIENT INTERCONNECT TEST MULTI-STRUCTURE

TECHNICAL FIELD OF INVENTION

The present invention relates generally to test structures utilized in semiconductor manufacturing, and, more particularly, to test structures formed in scribe lines which offer multiple testing configurations.

BACKGROUND OF THE INVENTION

As interconnect dimensions scale to smaller sizes, oxide layers become less robust, and current densities increase in today's integrated circuits, the reliability of interconnects becomes a greater concern due to, for example, metal diffusion, barrier breakdown, oxide failure, and increased electromigration effects. Electromigration (EM), which is the diffusion of atoms in an interconnect induced by an electric current, can lead to interconnect failure by voiding or extrusion at sites along the interconnect. Furthermore, electromigration is generally temperature dependent, wherein thermal gradients due to joule heating can increase the EM effects. Tensile and compressive stresses can develop in a variety ways within the interconnect, for example, due to a difference in temperature at which dielectric layers and metallization layers are processed in the formation of the circuit. Failure of the interconnect may occur, for example, once stress somewhere in the interconnect exceeds a critical stress. Therefore, test structures are conventionally incorporated into a circuit layout on a wafer. However, the test structures must be properly designed and constructed so as to detect these potential failures when tested. The test structures may also provide utility for process development and tuning, as well as for performance comparison purposes. Typically, the test structure may be formed, for example, using metal conductive layers such as aluminum or copper.

Figure 1A:
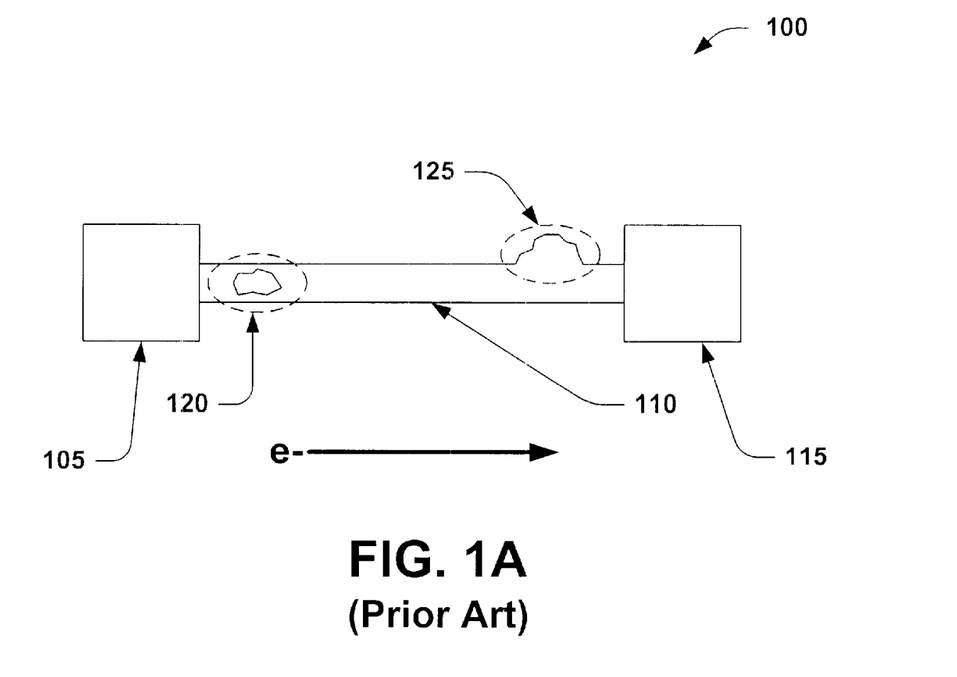
FIG. 1A illustrates a cross-sectional view of a conventional test structure according to the prior art.

FIG. 1A illustrates a cross-sectional view of an interconnect test structure 100 having a first conductor 105 (e.g., a cathode), a second conductor 110, and a third conductor 115 (e.g., an anode). The second conductor 110 generally forms an interconnect line between the first conductor 105 and the third conductor 115. FIG. 1A further illustrates a common failure mode, wherein voids 120 are formed near the region of the first conductor 105 due to a flow of electrical current and temperature gradients associated therewith. Voids 120 are typically paired with hillocks 125, that is, areas of metal accumulation, downstream in the electron flow. Hillocks 125 may cause, for example, metal filaments to extend from the second conductor 110 thereby forming paths of high current leakage. If the hillocks 125 are of a sufficient magnitude, a force exerted by the hillocks in the second conductor 110 (e.g., hillocks in a metal interconnect) may crack a surrounding barrier or dielectric material. Therefore, electrical and/or thermal stress testing of various types of interconnect structures is useful for determining the current density limits that circuit design engineers use in the design of product interconnect to assure maximum performance without sacrificing reliability.

Electromigration of atoms or ions from one point to another within the metal structure may cause a void at a location originally occupied by the moving atom, or alternatively, a deposition or growth at another location of the metal. In many configurations of integrated circuits, void formation very often decreases the life of the circuit, or may even result in failure of the circuit, thereby resulting in failure of a chip or system containing the circuit. The geometry of metallic interconnect lines associated with integrated circuits are generally thin and narrow, for example, less than a few tenths of a micron in depth and less than one-tenth of a micron in width, wherein electromigration may induce a void that results in a significant decrease in cross-sectional area of the electrically conductive material across the depth of width of the conductive line. Decreasing the volume of metal in the conductive path will tend to cause an increase in electrical resistance or failure of the line, or may even result in an open-circuit line. Therefore, it is highly desirable to be able to characterize electromigration properties as well as other properties of an interconnect system so as to determine a cumulative failure distribution, a median life time to failure (MTTF), the activation energy of interfacial diffusion, grain boundary or bulk diffusion, and the current density dependence.

In the past, such characterization data has been obtained through conventional DC electromigration tests performed on a packaged test chip or by wafer-level testing. To accelerate the wear of components, the test structures should endure stress current densities above the maximum used in product designs, (e.g., one million amps per square centimeter and higher), and elevated temperatures (e.g., on the order of about 150° C. to 250° C.) Furthermore, conventional test chips, or "plug bars", placed onto product wafers consumed significant amounts of wafer area which could otherwise be utilized for production chips. Problems associated with test chips (also called process monitor chips or "PMCs") may furthermore involve discrepancies in field densities across a wafer. For example, an SRAM chip comprises very densely populated structures and metal layers. A PMC formed on the same wafer, on the other hand, is generally sparsely populated as compared to the SRAM chip, and processes such as chemical mechanical polishing of metal layers may have a tendency to cause dishing in metal lines.

Another problem associated with test chips is that the test is conventionally conducted after the complete assembly of the chip. In a typical manufacture of a semiconductor chip, a large number of chips are generally formed on a single semiconductive wafer. Furthermore, numerous steps are typically performed subsequent to the formation of the chips on the wafer during final assembly, such that a long period of time may elapse before the final product is completed and ready for this testing. This typically means that all of the subsequent manufacturing steps and assembly must be completed, and assembly must be at least partially complete before the conventional type of lifetime testing or characterization of the test chip can be performed to determine whether or not the metal interconnect layers are satisfactory.

Figure 1B:
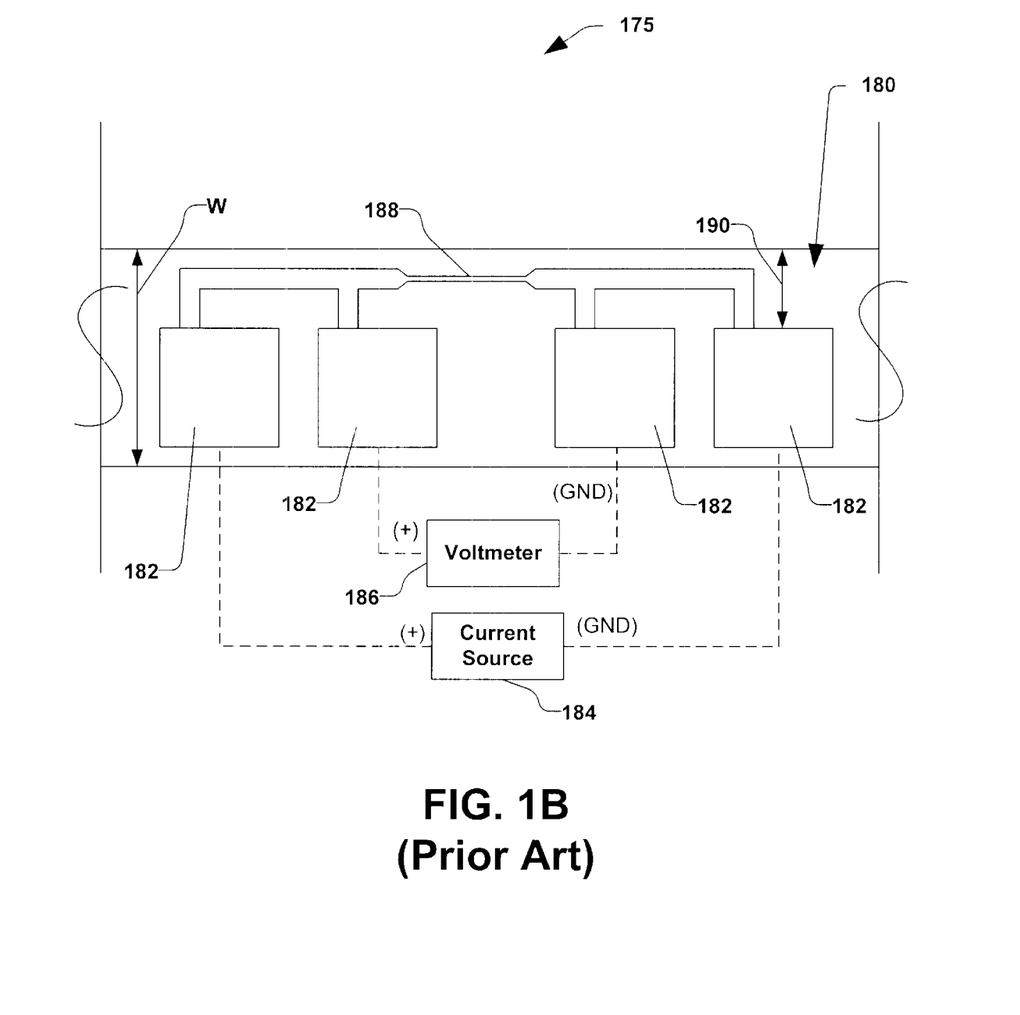
FIG. 1B illustrates a plan view of a conventional test structure formed within a scribe line according to the prior art.

In order to avoid some of the problems associated with PMCs and to optimize wafer area utilization, test structures have been moved from the usable chip areas to scribe lines. Scribe lines are the areas of a wafer which generally separate individual chips, wherein a diamond saw utilized in separating the chips generally cuts once the chip is finalized. FIG. 1B illustrates one prior art test structure 175 utilized for electromigration testing purposes, wherein the test structure resides within a scribe line 180. The test structure 175 comprises a plurality of solid pads 182, wherein a test probe (not shown) is operable to electrically contact the plurality of solid pads to induce an electrical current from a current source 184 and measure a voltage via a voltmeter 186 across the a conductive line 188 such as a bow-tie lead. The test structure 175 of the prior art, however, may suffer from several deficiencies. For example, in order to adequately accommodate the test probe, the solid pads 182 generally consume much of the width W of the scribe line, leaving only a small portion 190 available for the conductive line 188. The portion 190 of the scribe line 180 is usually limited to accommodating a limited number of conductive lines 188 in order to avoid encroachment onto the production chip area. Furthermore, there is typically not enough available area in the scribe line for the test structures of the prior art to characterize more than a few metal layers. Since other modules also occupy typical scribe lines, such as alignment marks for lithography and modules for characterizing transistor and diode quality, there is typically not enough space for adequate scribe line structures for characterizing back-end structures.

Accordingly, it is an object of the present invention to provide a test structure formed within the scribe line which incorporates various novel test structures and interconnect structures at various metal layers, such that the above mentioned problems are avoided or eliminated. Furthermore, an appropriate test structure is needed, wherein the test structure comprises multiple devices in order to detect various failure mechanisms and processing problems.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention relates generally to a test structure formed over a semiconductor substrate. According to one exemplary aspect of the present invention, a test structure is formed within a scribe line of a semiconductor substrate. The scribe line is characterized by a length and width associated with a surface of the wafer, as well as a height associated with a distance from active devices or conductive and insulating features implanted into the substrate on the surface of the wafer. The test structure comprises a plurality of patterned oxide layers with etched trenches filled with electrically conductive metal layers, wherein the plurality of metal layers are formed over the substrate and spaced along the height of the scribe line, and wherein one or more insulating layers are disposed between the plurality of metal layers.

According to one aspect of the invention, the plurality of metal layers formed within the scribe line further comprises one or more lower metal layers, wherein the one or more lower metal layers each comprises one or more split pads. The one or more split pads are longitudinally spaced along the length of the scribe line. The split pads comprise two pad portions oppositely disposed from one another and separated by a predetermined distance, whereby a channel is defined between the split pads. The channel furthermore traverses the length of the scribe line.

The plurality of metal layers further comprise a top metal layer formed over the one or more lower metal layers, wherein the top metal layer comprises a plurality of solid pads longitudinally spaced along the length of the scribe line. According to one exemplary aspect of the invention, two or more of the plurality of solid pads generally reside over two or more respective split pads associated with at least one lower metal layer, whereby two or more respective columns of pads are defined. The two or more columns of pads are furthermore spaced along the length of the scribe line in accordance with the spacing of the plurality of solid pads.

One or more longitudinal conduits associated with one or more lower metal layers are furthermore disclosed, wherein the one or more conduits electrically connect two or more of the split pads associated with the respective one or more lower metal layers. The one or more conduits generally reside within the channel between the split pads and at least one of the conduits is characterized by a first width and a second width, wherein the first width is larger than the second width, thereby defining a bow-tie lead. The test structure further comprises a plurality of pad vias, wherein the plurality of pad vias electrically connect the respective split pads and solid pads associated with the respective two or more columns of pads.

According to yet another exemplary aspect of the invention, the test structure further comprises two or more conduits associated with two or more of the lower metal layers. Furthermore, the test structure comprises one or more electrically conductive lead vias extending between the two or more conduits, thereby electrically connecting the two or more conduits therein. According to still another exemplary aspect of the invention, a multitude of combinations of longitudinal conduits and lead vias are combined to define a cascading test structure, wherein multiple metal layers comprising multiple test structures are formed.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is directed toward a test structure formed over a semiconductor substrate. Moreover, as opposed to conventional test structures formed in die areas of the wafer (e.g., process monitor chips or "PMCs"), the test structure of the present invention is formed within a scribe line of the substrate, wherein a plurality of patterned metal layers are utilized in both the die areas of the substrate as well as in the test structure formed within the scribe line. Providing the multi-layer test structure in the scribe line is advantageous in both terms of regaining active chip areas which were previously utilized for PMCs, as well as eliminating deleterious effects associated with feature density variation across the wafer.

Figure 2:
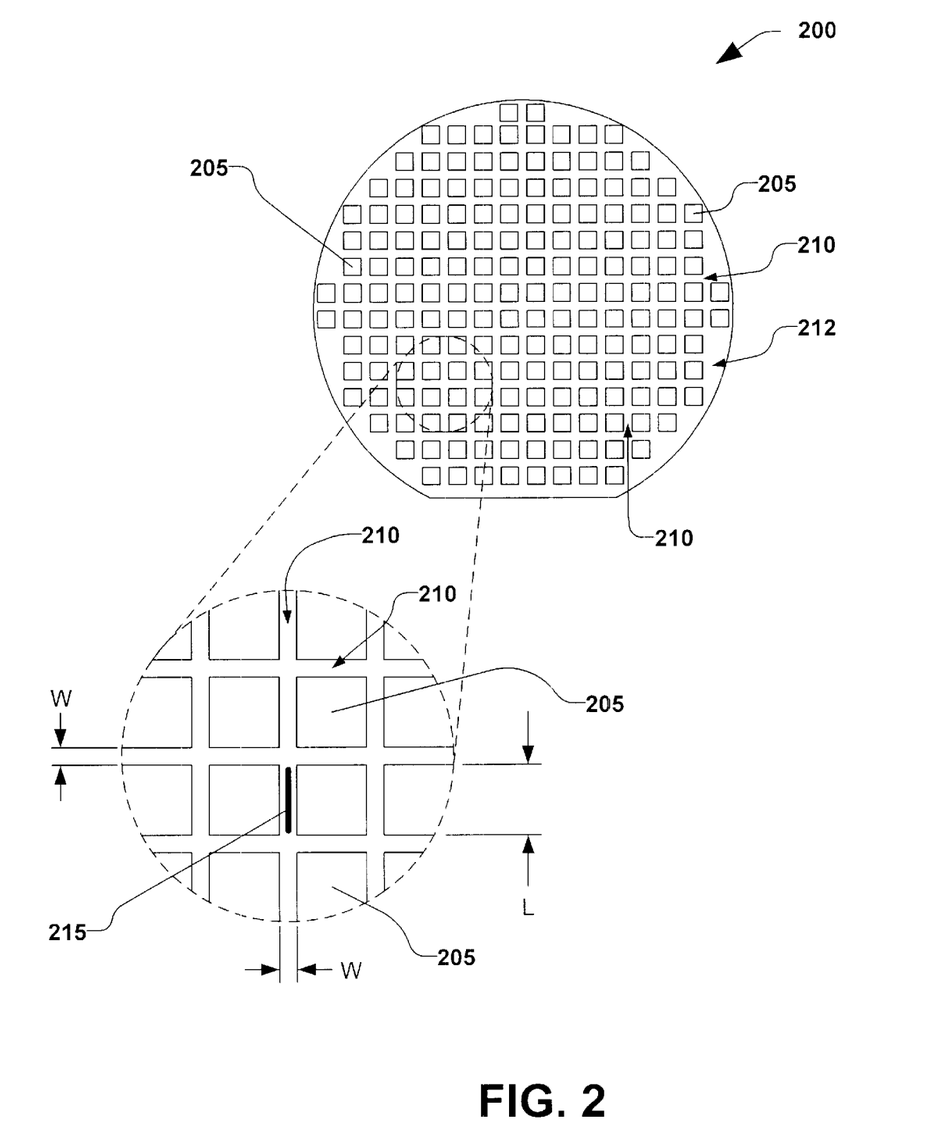
FIG. 2 illustrates a plan view of an exemplary substrate according to one aspect of the present invention.

Referring now to the FIG. 2, an exemplary substrate 200 is illustrated. It should be noted that the Figures disclosed in the present invention are intended to be generally illustrative in nature, and are not necessarily drawn to scale, and it should be understood that they shall not be interpreted to limit the scope of the present invention. As illustrated in FIG. 2, the substrate 200 comprises a plurality of active chip areas 205 (e.g., a plurality of dies) generally separated by a plurality of scribe lines 210, wherein a width W of the scribe line (e.g., a scribe line "street") associated with a surface 212 of the substrate is small, for example, wherein the width W is between 55 and 80 microns. The width W of the scribe line 210 of FIG. 2 is typically associated with a width of a saw (not shown) utilized in cutting the substrate 200 after the substrate is processed, thereby separating the individual dies 205. As will be understood by one of ordinary skill in the art, the width W of the scribe lines 210 should be as small as possible, such that a yield of dies 205 is maximized for each individual substrate or wafer 200, but should also be large enough to accommodate other structures such as alignment marks and other process monitoring devices (not shown).

The test structure 215 of the present invention is formed within the width W of a scribe line 210, wherein the scribe line is further characterized by a length L associated with the chip 205, and therefore the surface 212 of the substrate 200, and wherein the scribe line is furthermore characterized by a height (not shown) associated with a distance from the surface of the substrate. According to one exemplary aspect of the present invention, as illustrated in perspective view along the length L of the scribe line 210 in FIG. 3, an exemplary test structure 300 comprises a plurality of patterned electrically conductive metal layer layers 305 formed over the substrate 200. The plurality of metal layers 305 are spaced along a height H of the scribe line 210, and are associated, for example, with a respective plurality of wiring layers (not shown) utilized in forming interconnects in the chips 205 formed on the substrate 200. The plurality of metal layers 305 may be comprised of aluminum or copper, however any electrically conductive material used as a wiring layer may be utilized, as will be understood by one of ordinary skill in the art. One or more insulating layers (not shown), such as phosphosilicate glass (PSG), borophosphosilicate glass (BPSG), or other oxides are furthermore formed over the substrate 200, wherein the one or more insulating layers are disposed between the plurality of metal layers 305 to electrically insulate each metal layer 305.

Figure 3:
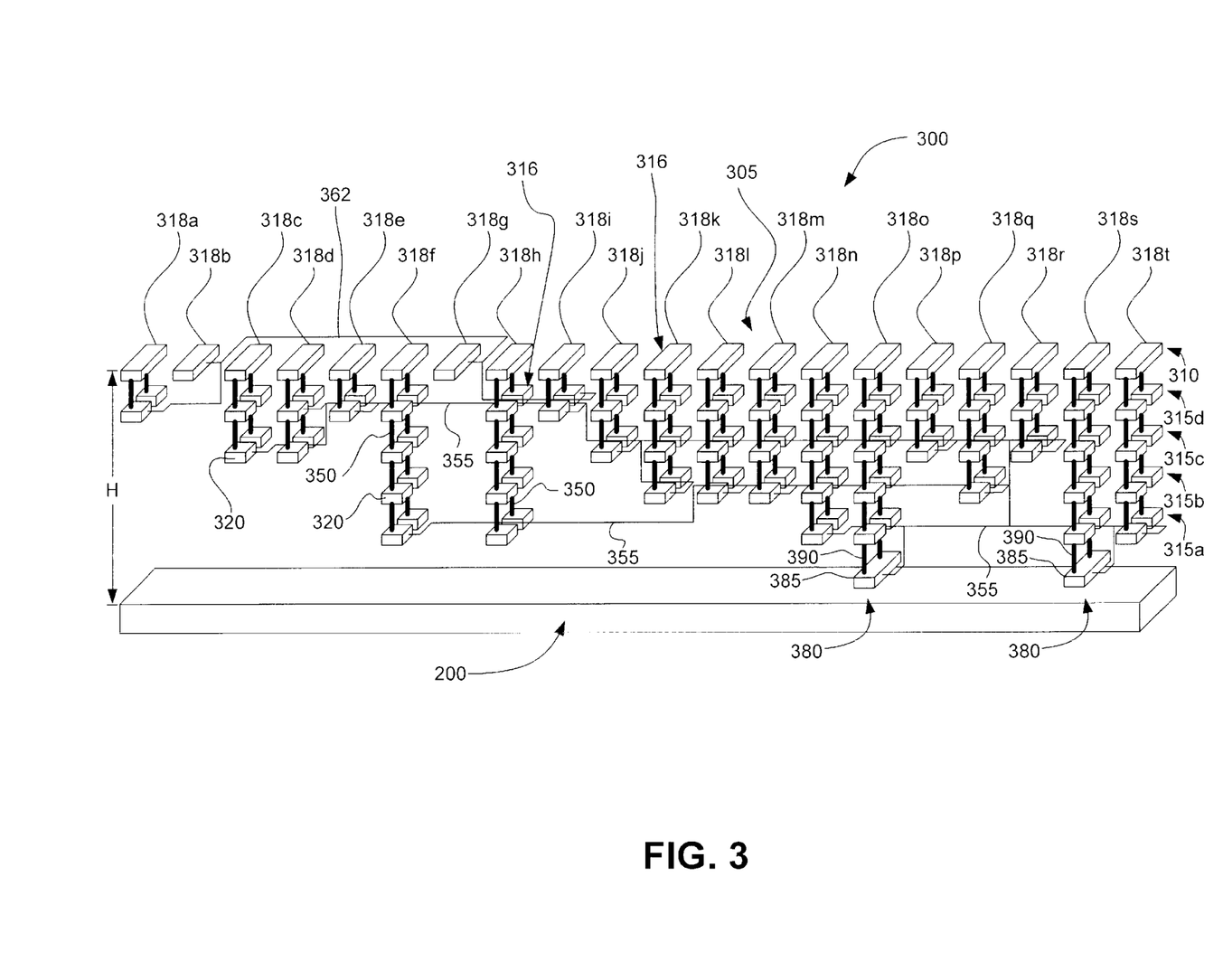
FIG. 3 illustrates a perspective view of an exemplary test structure according to one aspect of the present invention.

The plurality of metal layers 305 further comprise a top metal layer 310 and one or more lower metal layers 315. The top metal layer 310 and the one or more lower metal layers 315 comprise a plurality of electrically conductive pads 316, wherein the plurality of pads are generally arranged in vertical columns 318, whereby each column comprises at least one pad associated with the top metal layer. An exemplary column 318 may comprise a pad 316 associated with the top metal layer 310 and one or more pads associated with one or more respective lower metal layers 315 (e.g., column 318c comprising a pad associated with the top metal layer and two pads associated with two lower metal layers). Alternatively, a column 318 may comprise only the pad 316 associated with the top metal layer 310, such as exemplary column 318g. According to another example, each column 318 may comprise a pad 316 associated with the top metal layer 310 and one or more pads associated with the respective one or more lower metal layers 315, as illustrated in the exemplary test structure 322 in FIG. 4.

Figure 5:
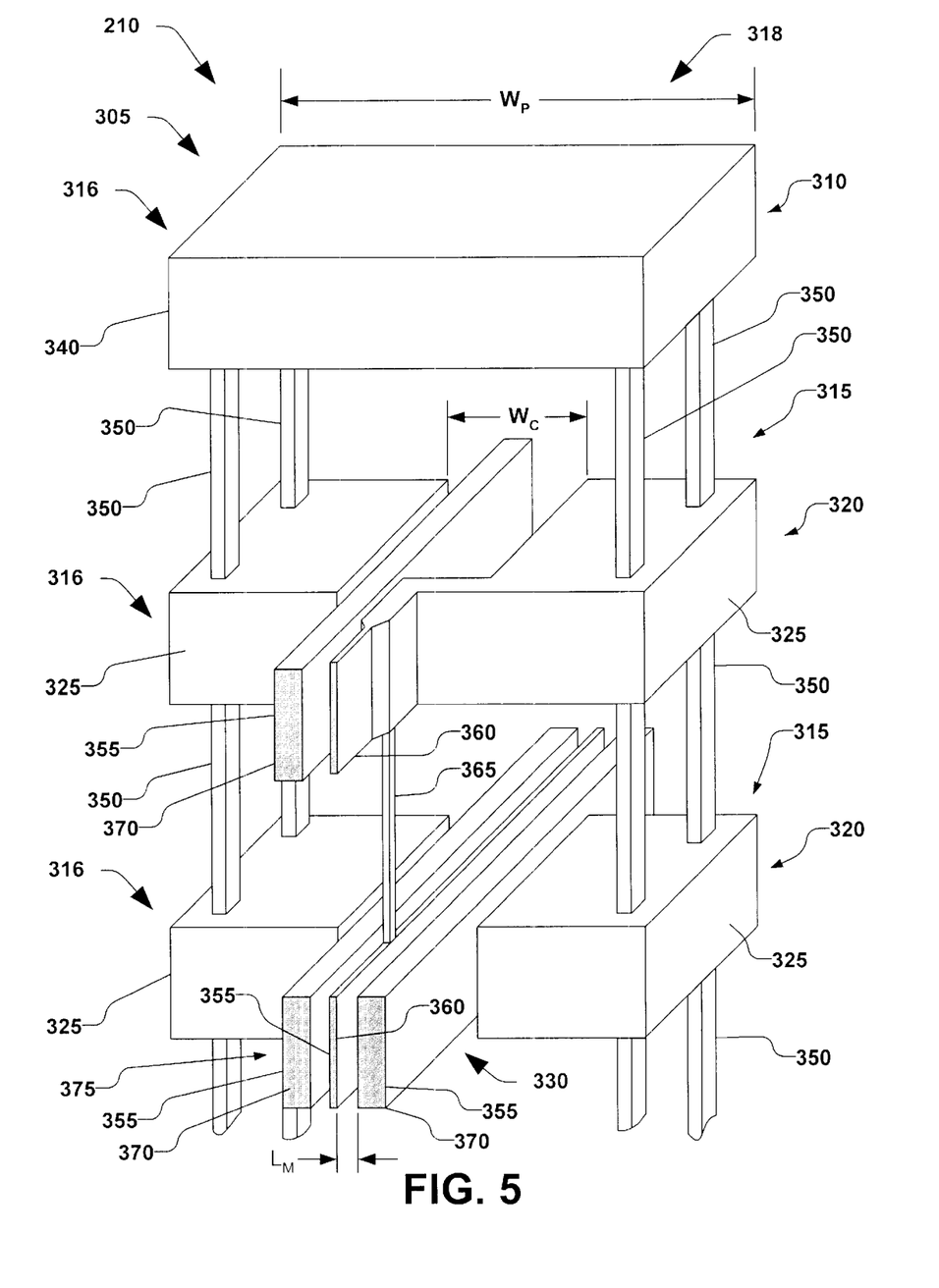
FIG. 5 illustrates a partial side perspective view of an exemplary test structure according of another aspect of the present invention.

Referring now to FIG. 5, a side perspective view of an exemplary column 318 is illustrated. The plurality of pads 316 are generally characterized by a pad width $W_p$, wherein the pad width, for example, is between 50 and 70 microns wide. The pad width $W_p$, for example, is smaller than the width W of the scribe line (not shown), but is sized sufficiently to accommodate a test probe (not shown) as will be discussed hereafter. Referring again to FIG. 3, each of the columns 318 are longitudinally spaced from one another along the length L of the scribe line 210 by a predetermined distance. The plurality of columns 318 may alternatively be spaced along only a portion (not shown) of the length L of the scribe line 210, wherein only the portion of the length of the scribe line is utilized by the test structure 215.

According to another exemplary aspect of the present invention, the one or more lower metal layers 315, comprise a plurality of split pads 320. Referring again to FIG. 5, each of the split pads 320 further comprises two pad portions 325. The two pad portions 325 of each split pad 320 are oppositely disposed from one another and separated by a predetermined distance, thereby defining a channel 330 between the plurality of split pads 320. According to one example, the channel 330 traverses the length L of the scribe line 210 illustrated in FIG. 3. The channel 330 is furthermore characterized by a channel width $W_c$, wherein the channel width, for example, is less than 10 microns. As illustrated in a plan view in FIG. 6, an exemplary split pad 320 is shown, wherein the split pad 320 comprises, for example, a plurality of reinforcement members 335. The plurality of reinforcement members 335 generally provide structural rigidity to the columns 318 of FIG. 3, and comprise, for example, a patterned oxide.

According to another exemplary aspect of the present invention, the top metal layer 310 of FIG. 3 comprises a plurality of solid bond pads 340. As compared to the split pads 320 of the lower metal layers 315, the plurality of solid bond pads 340 generally permit the test probe (not shown) to contact the top metal layer 310 without significant damage to the test structure 210, as well as maximizing contact area for the test probe.

Figure 6:
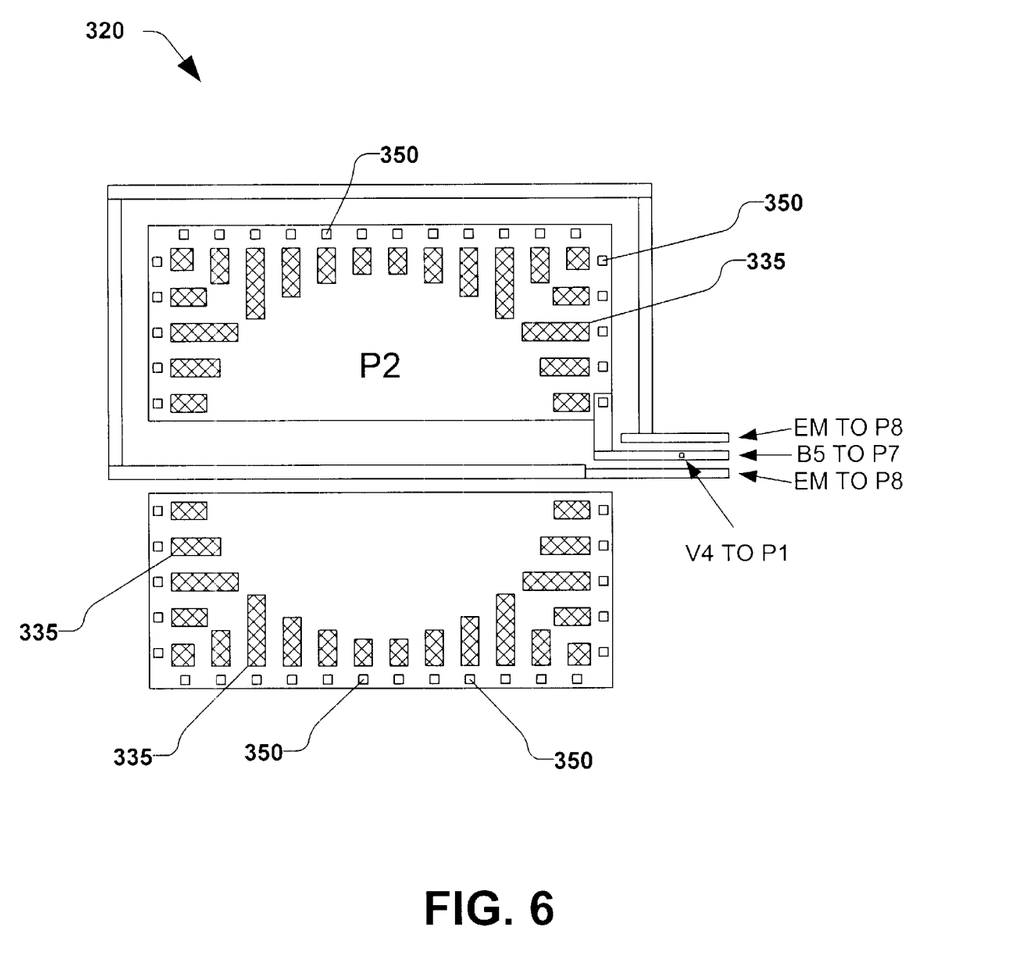
FIG. 6 illustrates a plan view of an exemplary split pad according to yet another aspect of the present invention.

FIG. 3 illustrates another exemplary aspect of the present invention, wherein the test structure 300 further comprises a plurality of pad vias 350. Referring again to FIG. 5, the plurality of pad vias 350 electrically connect one or more split pads 320 associated with the one or more lower metal layers 315 and the solid bond pad 340 associated with the respective column 318 of pads 316. The plurality of pad vias 350, for example, are comprised of tungsten or copper, and generally connect two or more metal layers 305. FIG. 6 further illustrates the plurality of pad vias 350 in plan view.

According to another exemplary aspect of the present invention, FIG. 3 illustrates one or more longitudinal conduits 355 associated with the one or more lower metal layers 315, wherein the one or more conduits electrically connect two or more of the split pads 320 associated with the respective one or more lower metal layers. For example, a conduit 355 electrically connects the split pad 320 residing in column 318$d$ on lower metal layer 315$d$ to the split pad residing in column 318$i$ on the same lower metal layer. As illustrated in FIG. 5, the one or more conduits 350 associated with the one or more lower metal layers.315 generally reside within the channel 330 defined by the plurality of split pads 320. As will be understood by one of ordinary skill in the art, providing one or more conduits 355 within the channel 330 is clearly advantageous over prior art test structures. Customarily, metal leads to be tested were routed on a periphery of solid pads along the length of the scribe line, and sufficient space was not available to include extrusion monitors or a lead width significantly greater than the design rule minimum width. Furthermore, prior art test structures were generally not able to detect some of the more subtle characteristics encountered in back-end process tuning and development, such as metallization failure mechanisms associated with wide metal leads. The present invention overcomes the shortcomings of the prior art by providing one or more conduits 355 which generally reside between the split pads 325.

Figure 7A:
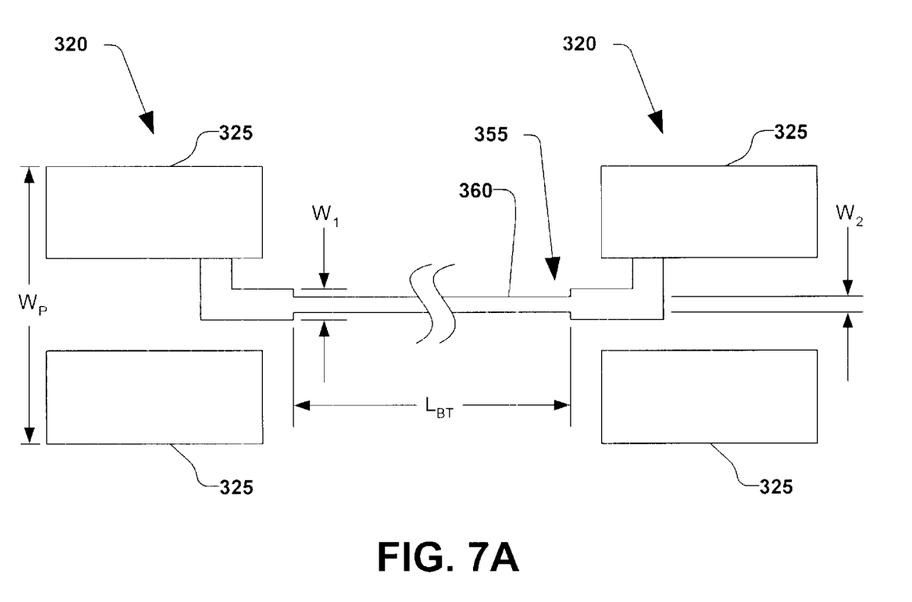
FIG. 7A illustrates a plan view of an exemplary bow-tie lead according to one aspect of the present invention.

FIG. 7A illustrates another exemplary aspect of the present invention, wherein at least one of the one or more conduits 355 electrically connecting two or more split pads 325 is characterized by a first width $W_1$ and a second width $W_2$, wherein the first width is larger than the second width, thereby defining a bow-tie lead 360. The second width $W_2$, for example, can be a design rule minimum width of the respective metal layer 305 of FIG. 3, as will be understood by one of ordinary skill in the art. For example, metal layers 305 utilized in local signal path processing generally have a design rule minimum width (e.g., 0.2 microns or less) which are routed in relatively shorter lengths and are generally more near the substrate than a design rule minimum width for metal layers utilized in controlling power to a circuit (e.g., 0.4 microns). Therefore, the conduits 355 associated with metal layers 305 having smaller design rule minimum widths, for example, will be smaller than those associated with larger design rule minimum widths. Furthermore, current density (J) variations between varying metal layers 305 can be accounted for by adjusting the width of the conduits 355, wherein thinner metal layers such as signal lead layers will have a larger width $W_2$ in the bow-tie leads than thicker metal layers, such as bus lead layers, as will be understood by one of ordinary skill in the art.

Figure 4:
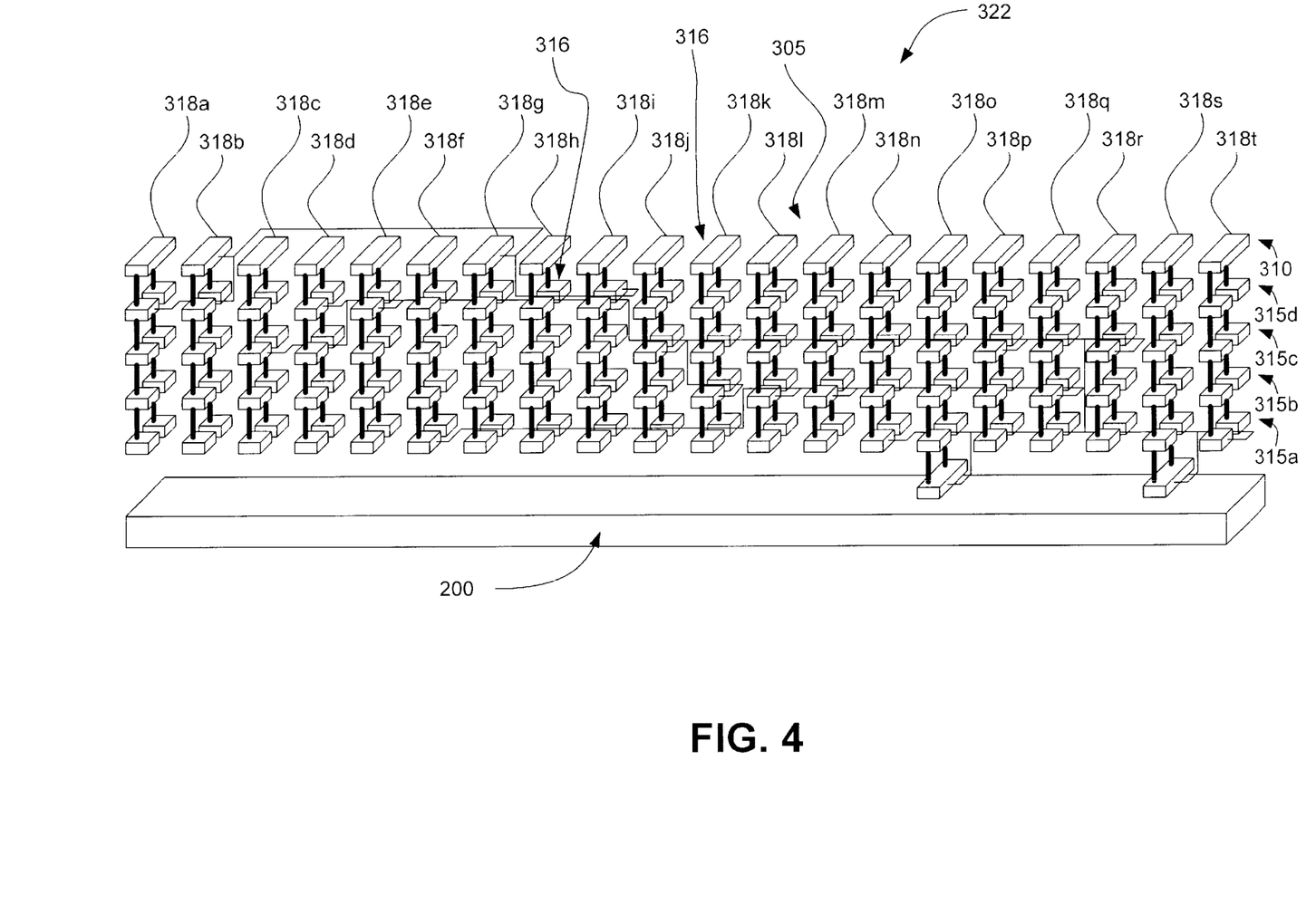
FIG. 4 illustrates a perspective view of another exemplary test structure according to one aspect of the present invention.

The bow-tie lead 360 of FIG. 7A is further characterized by a length $L_{BT}$, wherein the length of the bow-tie lead 360 is generally measured between the two split pads 320 at the second width $W_2$ of the conduit 355, and wherein the length, for example, ranges from 200 to 1000 microns to detect EM behavior. The length $L_{BT}$ of the bow-tie lead 360 can be adjusted, for example, by adjusting the predetermined distance separating the two columns 318, or by separating the two columns by one or more intermediate columns, as illustrated in FIGS. 3–5. According to one exemplary aspect of the invention, the two columns 318 connecting the bow-tie lead 360 are separated by at least four intermediate columns. Referring again to FIG. 3, according to yet another exemplary aspect of the present invention, a top layer bow-tie lead 362 can furthermore be formed on the topmost metal layer 310, wherein the bow-tie lead is routed around a periphery of the solid pads 340 associated with the top metal layer.

Figure 7B:
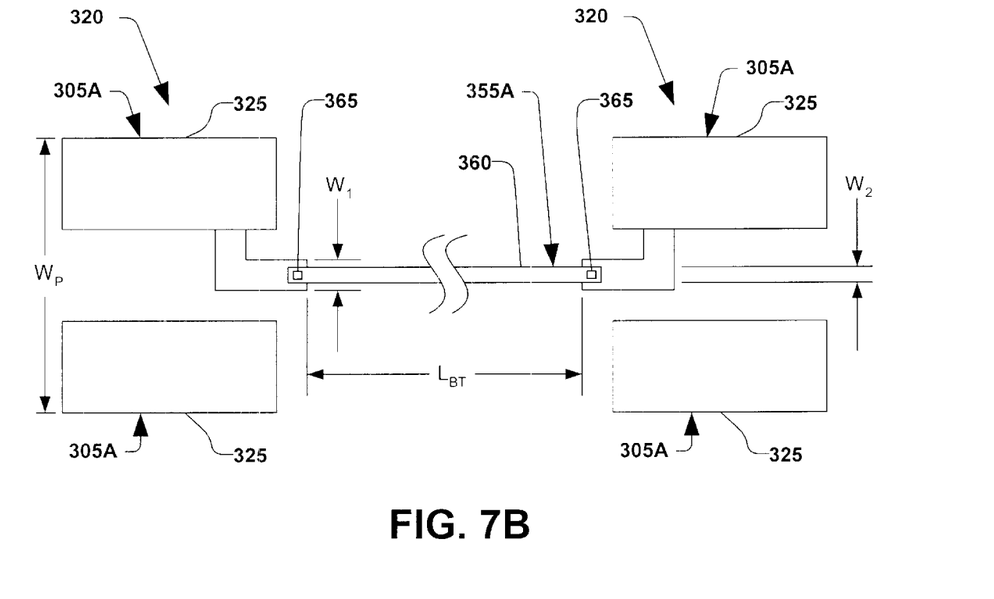
FIG. 7B illustrates a plan view of an exemplary via-fed lead according to another aspect of the present invention.
Figure 7C:
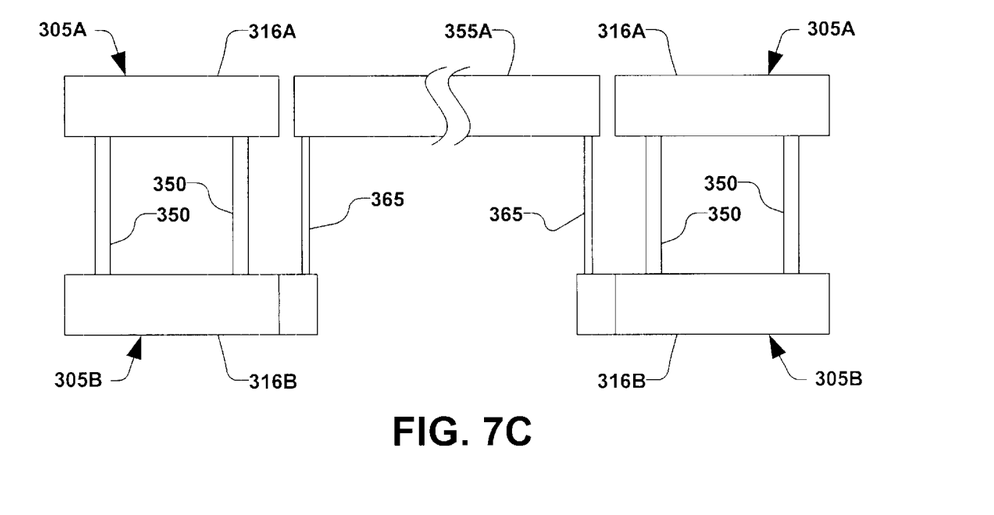
FIG. 7C illustrates a cross-sectional view of an exemplary via-fed lead according to another aspect of the present invention.

According to still another exemplary aspect of the present invention, FIG. 5 further illustrates one or more electrically conductive lead vias 365 formed over the substrate (not shown), wherein the one or more lead vias extend between and electrically connect two conduits 355 associated with two or more respective metal layers 305. The one or more lead vias 365 are comprised of, for example, tungsten or copper. For example, FIGS. 7B and 7C illustrate in plan an cross-sectional views, respectively, two metal layers 305A and 305B, wherein lead vias 365 electrically connect a conduit 355A associated with metal layer 305A to pads 316B associated with metal layer 305B. As will be understood by one of ordinary skill in the art, two or more lead vias 365 may be utilized to electrically connect two or more pads 316 residing on two or more metal layers 305, wherein the two or more lead vias furthermore define a via stack (not shown).

Figure 8:
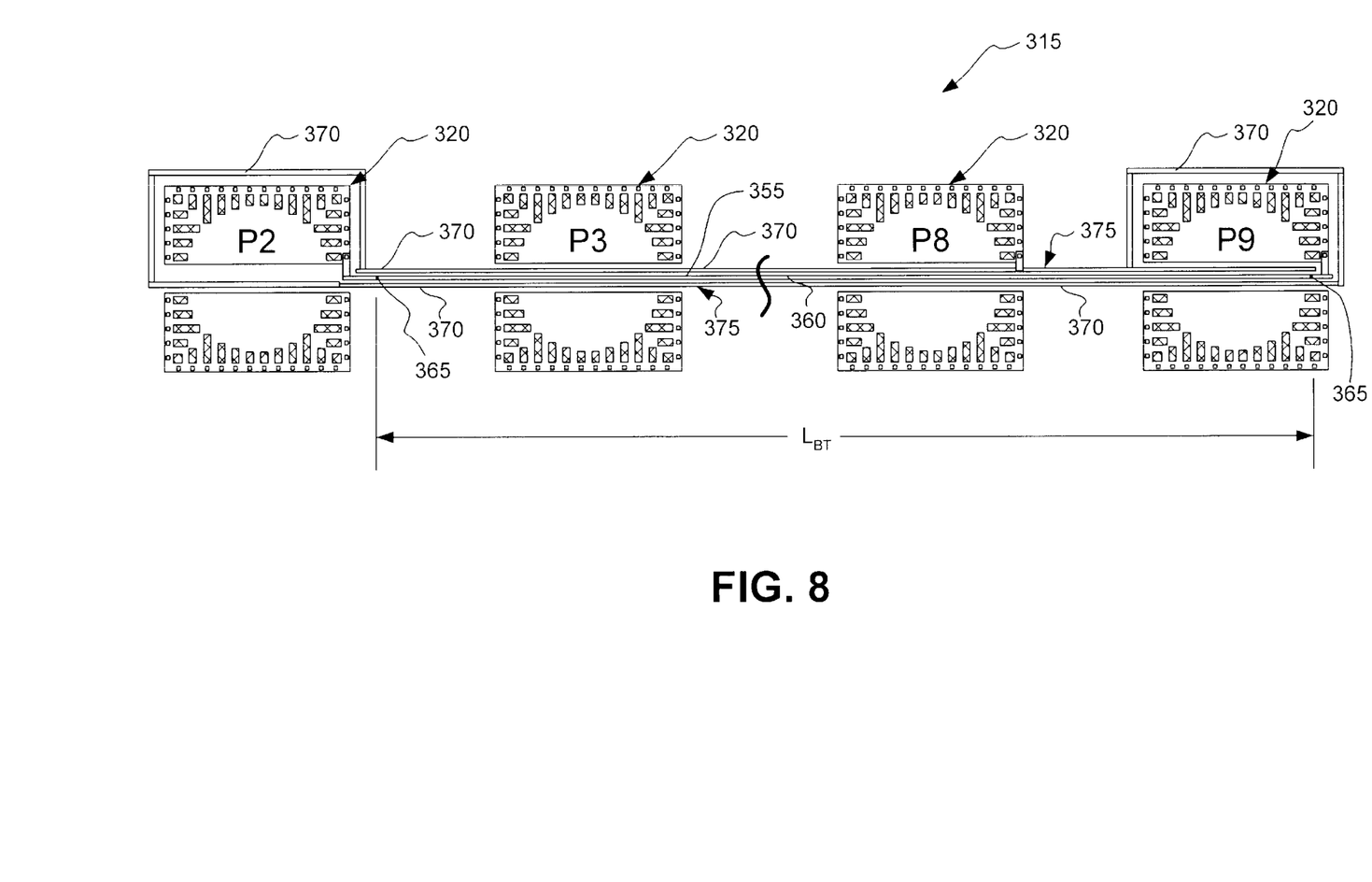
FIG. 8 illustrates a plan view of an exemplary bow-tie lead with extrusion monitors according to still another aspect of the present invention.

Yet another exemplary aspect of the invention is illustrated in FIG. 5, wherein one or more of the lower metal layers 315 comprise one or more electrically conductive extrusion monitors 370. For purposes of clarity, FIGS. 3 and 4 do not illustrate extrusion monitors, however, as will become clear to one of ordinary skill in the art, such extrusion monitors as described hereafter may be incorporated into the test structures 300 and 322, respectively. The one or more extrusion monitors 370, for example, as illustrated in FIG. 8, generally extend along the length $L_{BT}$ of one or more respective conduits 355, wherein one or more portions 375 of the one or more extrusion monitors generally resides along a periphery of one or more respective conduits. The one or more extrusion monitors 370 are furthermore electrically connected to at least one of the plurality of split pads 320 associated with the respective metal layer 305. Referring again to FIG. 5, the one or more portions 375 of the one or more extrusion monitors 370 are laterally spaced a predetermined distance $L_M$ from the one or more conduits 355, wherein the one or more extrusion monitors are operable to detect a short circuit condition or a leakage current associated with the respective conduit under thermal, electrical, or mechanical stress. For example, if a bow-tie lead 360 fails due to electromigration, and a portion (not shown) of the bow-tie lead may be laterally extruded toward the extrusion monitor 370, a leakage current of short circuit may be detected through the split pad (not shown) associated with the extrusion monitor.

Figure 9:
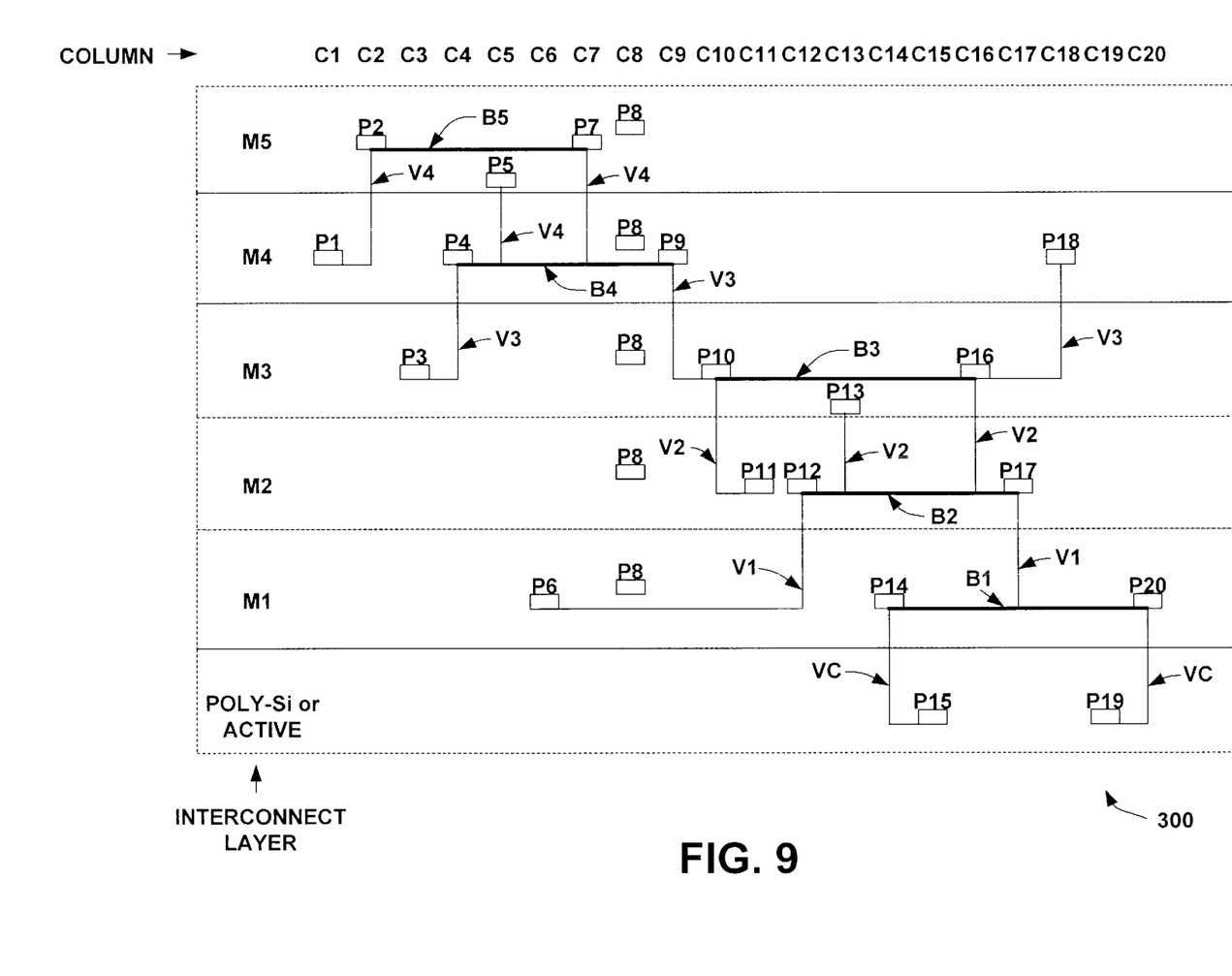
FIG. 9 illustrates a schematic of an exemplary test structure according to another aspect of the present invention.

FIG. 9 illustrates a schematic representation of the exemplary test structure 300 according to the present invention. The test structure 300 comprises five metal layers depicted as metal layers M1–M5. The top metal layer M5 comprises twenty solid pads P1–P20 which reside within the scribe line (not shown), wherein the top metal layer M5 generally defines twenty columns C1–C20 comprising the plurality of solid pads P1–P20. The plurality of split pads (not shown)

residing below the solid pads P1–P20 on lower metal layers M1–M4 electrically connect to the top metal layer M5 through the plurality of pad vias (not shown) for each respective column C1–C20. A plurality of bow-tie leads B1–B5 are illustrated, wherein each of the bow-tie leads respectively electrically connect two columns of pads, and a plurality of lead vias V1–V4 and contact via leads VC are further illustrated, wherein the plurality of lead vias electrically connect two or more conduits (not shown) associated with two or more respective metal layers M1–M5. Furthermore, each lower metal layer M1–M4 is associated with an extrusion monitor (not shown) electrically connected to solid pad P8, wherein each bow-tie lead B1–B4 is associated with a respective extrusion monitor. As will be understood by one of ordinary skill in the art, any electrically conductive conduit may be substituted for any of the plurality of bow-tie leads B1–B5 wherein the electrically conductive conduit electrically connects two or more columns of pads, and all such conduits are contemplated as falling within the scope of the present invention. As will be understood by one of ordinary skill in the art, the exemplary test structure 300 disclosed in the present invention can be configured in a myriad of configurations, providing numerous arrangements for characterizing a plurality of metal layers within a scribe line. It should be noted that, whereas the exemplary test structure 300 is illustrated as comprising five metal layers, any number of metal layers as well as active regions in the substrate and polysilicon conductive layers may be utilized in accordance with the present invention, and are contemplated as falling within the scope of the present invention. Furthermore, the test structure 300 of the present invention can incorporate additional test structures, and all such structures are contemplated as falling within the scope of the present invention. Additionally, the scope of the present invention is not limited to 20 columns of pads, and a length of the test structure may extend to any appropriate length within the scribe line comprising any number of pads. Exemplary test structures may include, but are not limited to, poly heaters, serpentine leads, wide leads at an interconnect level, or other structures which can utilized the split pads disclosed in the present invention. Poly-Si heaters, for example, utilizes one conduit to heat another conduit. A high current can be run through polysilicon, for example, to simulate a higher temperature in the test structure without affecting other components. Serpentine leads, for example, can be utilized wherein extrusion monitors are interwoven as comb-like structures between a serpentine lead, wherein stress migration, electromigration and leakage performance of the serpentine lead can be characterized.

A plurality of test configurations utilizing conduits, via-fed leads, bow-tie leads, Van der Pauw leads, as well as a plurality of combinations of any or all of the aforementioned leads or other test structures may be utilized in accordance with the present invention to determine the reliability of interconnects due to, for example, metal diffusion, barrier breakdown, oxide failure, and electromigration effects. For example, a Kelvin 4-point probe (not shown) can be utilized in conjunction with the test structure 300 illustrated in FIGS. 4 and 9, wherein a bow-tie lead can be tested for electromigration effects. For example, current force probes (not shown) may be applied to pads P4 and P9 in order to electrically stress the bow-tie lead B4 residing on metal layer M4. Sense probes (not shown) may be connected to pads P3 and P10, whereby a voltage may be sensed during the electrical stressing of the bow-tie lead B4. As will be understood by one of ordinary skill in the art, the bow-tie lead B4 can therefore be characterized. Furthermore, a sense probe (not shown) may also be connected to pad P8, such that an extrusion of the bow-tie lead B4 into the insulating layer (not shown) can be sensed, as described above. Alternatively, the current force probes may be applied to pads P3 and P10 in order to electrically stress the lead vias V3 residing between metal layers M3 and M4. Sense probes may be connected to pads P4 and P9, whereby a voltage may be sensed during the electrical stressing of the lead vias V3 in order to characterize the lead vias. Furthermore, polarity can be changed by switching positive and negative probes in order to vary the measurements.

In accordance with yet another exemplary aspect of the present invention, a plurality of conduits comprising, for example, a plurality of bow-tie leads and lead vias, may be utilized to determine the reliability of multiple metal layers and multiple interconnects. For example, pads P1 and P20 may be electrically connected by the plurality of bow-tie leads and lead vias V4, B5, B4, V3, B3, V2, B2, V1, and B1, and constant current force may be applied between pads P1 and P20. A voltage may be then be sensed at any two of the pads therebetween (e.g., pads P2 and P19), wherein one or more intermediate interconnects may be tested.

According to yet another exemplary aspect of the present invention, a plurality of top metal layers reside over the lower metal layers, wherein one or more lower metal layers reside over at least one of the top metal layers. Such an arrangement can provide for intermediate characterization of the test structure between distinct fabrication processes. Referring again to FIG. 3, according to still another exemplary aspect of the present invention the semiconductor substrate 200 comprises one or more doped regions 380, wherein one or more pads 316 associated with a lower metal layer 315a in closest proximity to the substrate are electrically connected to the one or more respective doped regions. For example, one or more conductor pads 385 electrically contact the one or more respective doped regions 385 of the substrate 200 through one or more conductor vias 390. According to another example, a plurality of conductor vias 390 are electrically connected to the one or more doped regions 380, and one or more lead vias (not shown) are furthermore electrically connected to the doped regions 380. Such a configuration generally permits a test of the lead vias (not shown) connected to the one or more doped regions. For example, the lead vias (not shown), sometimes referred to as contacts, can be connected to p-moats or n-moats, that is, p or n doped regions of the substrate 200, as well as n or p doped or undoped polysilicon, as illustrated in FIG. 9.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A test structure formed over a semiconductor substrate within a scribe line, the scribe line having a length and width associated with a surface of the substrate and a height associated with a distance from the surface of the substrate, the test structure comprising:

a plurality of patterned electrically conductive metal layers formed over the substrate and spaced along the height of the scribe line, the plurality of metal layers further comprising:

one or more lower metal layers formed over the substrate, the one or more lower metal layers comprising a plurality of split pads longitudinally spaced along the length of the scribe line, the split pads each comprising two pad portions oppositely disposed from one another and separated by a predetermined distance, thereby defining a channel between the plurality of split pads, wherein the channel traverses the length of the scribe line;

a top metal layer formed over the one or more lower metal layers, the top metal layer comprising a plurality of solid pads longitudinally spaced along the length of the scribe line by a predetermined distance, wherein two or more of the plurality of solid pads generally reside over the plurality of split pads, thereby defining a respective plurality of columns of pads, wherein the plurality of columns of pads are spaced along the length of the scribe line in accordance with the spacing of the plurality of solid pads; and one or more longitudinal conduits associated with one or more lower metal layers, wherein the one or more conduits electrically connect two or more split pads associated with the respective one or more lower metal layers, wherein the one or more conduits generally reside within the channel, and wherein at least one of the one or more conduits is characterized by a first width and a second width, wherein the first width is larger than the second width, thereby defining a bow-tie lead;

one or more insulating layers disposed between the plurality of metal layers; and a plurality of pad vias, wherein the plurality of pad vias electrically connect the respective split pads and solid pads associated with the respective two or more columns of pads.

2. The test structure of claim 1, comprising two or more conduits associated with two or more lower metal layers, the test structure further comprising one or more electrically conductive lead vias, wherein the one or more lead vias extend between the two or more conduits associated with the two or more respective metal layers, electrically connecting the two or more conduits therein.

3. The test structure of claim 1, wherein each of the plurality of columns are longitudinally spaced from one another by a predetermined distance.

4. The test structure of claim 1, wherein a length of the second width of the bow-tie lead is between 200 microns and 1000 microns.

5. The test structure of claim 1, comprising two or more bow-tie leads residing on two or more respective metal layers, wherein a cross-sectional area at the respective first width and second width of each conduit is generally equal across the plurality of metal layers.

6. The test structure of claim 1, further comprising one or more longitudinal top conduits associated with the top metal layer, wherein the one or more top conduits electrically connect two or more solid pads associated with the top metal layer, wherein the one or more top conduits generally reside adjacent to two or more solid pads, and wherein at least one of the one or more top conduits is characterized by a first width and a second width, wherein the first width is larger than the second width, thereby defining a top layer bow-tie lead.

7. The test structure of claim 6, wherein a length of the second width of the top layer bow-tie lead is between 200 and 1000 microns.

8. The test structure of claim 1, wherein the two or more split pads electrically connected by the one or more conduits are separated by at least a length of four split pads.

9. The test structure of claim 1, wherein the solid pads are characterized by a length and width which is larger than a pin associated with a test card, wherein two or more solid pads are operable to be electrically contacted by two or more pins of a test card, and wherein a plurality of pins associated with the test card.

10. The test structure of claim 1, wherein a length and width of each solid pad is between 50 and 70 microns.

11. The test structure of claim 1, wherein the width of the scribe line is less than approximately 78 microns.

12. The test structure of claim 1, wherein the predetermined distance separating the two pad portions oppositely disposed from one another is less than 10 microns.

13. The test structure of claim 1, wherein the solid pads and split pads comprise a metal selected from the group consisting of tungsten, copper, and aluminum.

14. The test structure of claim 1, wherein the solid pads and split pads comprise a plurality of patterned oxide reinforcement members.

15. The test structure of claim 1, wherein one or more of the lower metal layers further comprises one or more electrically conductive extrusion monitors laterally spaced a predetermined distance from one or more bow-tie leads associated with the respective lower metal layer, wherein a portion the one or more extrusion monitors generally reside about a periphery of one or more respective bow-tie leads and are electrically connected to one or more of the split pads, and wherein the one or more extrusion monitors are operable to detect a short circuit condition between the extrusion monitor and the respective bow-tie lead.

16. The test structure of claim 1, wherein the semiconductor substrate comprises one or more doped regions, wherein one or more split pads associated with a lower metal layer closest to the surface of the semiconductor substrate is electrically connected to the one or more respective doped regions by one or more pad vias.

17. The test structure of claim 16, wherein the one or more doped regions comprise one or more doped polysilicon moats.

18. The test structure of claim 1, comprising two lead vias electrically connected to two of the plurality of lower metal layers, wherein the two lead vias are operable to be utilized as a Van der Pauw leads.

19. The test structure of claim 1, comprising twenty solid pads and five metal layers, wherein one or more of the five metal layers proximate to the surface of the semiconductor substrate comprise signal leads.

20. The test structure of claim 1, comprising two or more top metal layers, wherein one or more lower metal layers reside over at least one of the top metal layers.

* * * * *